United States Patent [19]

Swisher

[11] 4,331,012
[45] May 25, 1982

[54] LOCKABLE METER RETENTION RING

[76] Inventor: James A. Swisher, 464 Mill Hill Dr., Southport, Conn. 06490

[21] Appl. No.: 122,753

[22] Filed: Feb. 19, 1980

[51] Int. Cl.³ .................. B65D 45/30; B65D 55/14; F16L 37/08; G01R 11/04

[52] U.S. Cl. ............................. 70/164; 70/166; 70/165; 285/80; 285/91; 285/92; 285/408; 292/256.6; 292/327; 220/319; 220/210; 361/369; 361/371

[58] Field of Search .............. 70/164, 170, 158, 165, 70/166, 371, 231, 232; 285/365, 81, 92, 90, 91, 86, 408, 373, 407, 364, 366, 365, 419, 405, 423; 292/256.6, 327; 220/319, 210; 215/274, 275; 361/369, 371, 364; 403/338

[56] References Cited

U.S. PATENT DOCUMENTS

| | | | |
|---|---|---|---|
| 200,599 | 2/1878 | Beachman | 70/165 X |
| 571,262 | 11/1896 | Cowart | 285/80 X |
| 1,332,291 | 3/1920 | Goodell | 292/327 |
| 1,760,977 | 6/1930 | Duffy | 70/231 X |
| 2,117,473 | 5/1938 | Glab | 70/170 X |
| 2,210,340 | 8/1940 | Reinhardt | 285/419 X |
| 2,322,347 | 6/1943 | Churchman | 70/232 |
| 2,469,973 | 5/1949 | Malluk | 70/232 |
| 2,852,282 | 9/1958 | Smisko et al. | 285/365 X |
| 2,895,637 | 7/1959 | Bakke et al. | 361/364 X |
| 3,440,330 | 4/1969 | Sloop | 361/369 |
| 3,928,990 | 12/1975 | Stenz | 70/371 X |
| 4,008,585 | 2/1977 | Lundberg | 70/164 |
| 4,110,814 | 8/1978 | Britton et al. | 361/371 |
| 4,146,258 | 3/1979 | Andruchiw | 285/407 X |
| 4,158,953 | 6/1979 | Nielsen, Jr. | 70/164 |
| 4,300,373 | 11/1981 | Camos et al. | 70/164 X |

FOREIGN PATENT DOCUMENTS

| | | | |
|---|---|---|---|
| 511690 | 6/1952 | Belgium | 285/408 |
| 1012498 | 7/1957 | Fed. Rep. of Germany | 285/91 |
| 1037818 | 9/1953 | France | 215/274 |
| 540375 | 10/1941 | United Kingdom | 285/365 |
| 866626 | 4/1961 | United Kingdom | 285/81 |

Primary Examiner—Roy D. Frazier
Assistant Examiner—Carl F. Pietruszka
Attorney, Agent, or Firm—Robert E. Ross

[57] ABSTRACT

Lockable meter retention rings for securing electric meters in meter boxes comprise an inner ring of multiple arcuate parts wherein the inner ring has spaced-apart inwardly extending flanges for holding the electric meter in the meter box and a steel outer ring which fits over and engages with the inner ring wherein the outer ring keeps the inner ring assembled. The outer ring has a lock enclosure which, together with a portion of the inner ring, defines an opening for receiving and retaining a barrel lock, the barrel lock securing the rings together. Bayonet and screw type engagements between the inner and outer rings are disclosed, with the barrel lock preventing relative rotation of the rings necessary to disengage them. Another form of engagement has a flange of the outer ring received by the inner ring, with the barrel lock securing the outer ring to the inner ring diametrically opposite the flanged engagement. Various lock enclosures are described having both front and side entry openings for the barrel lock.

22 Claims, 20 Drawing Figures

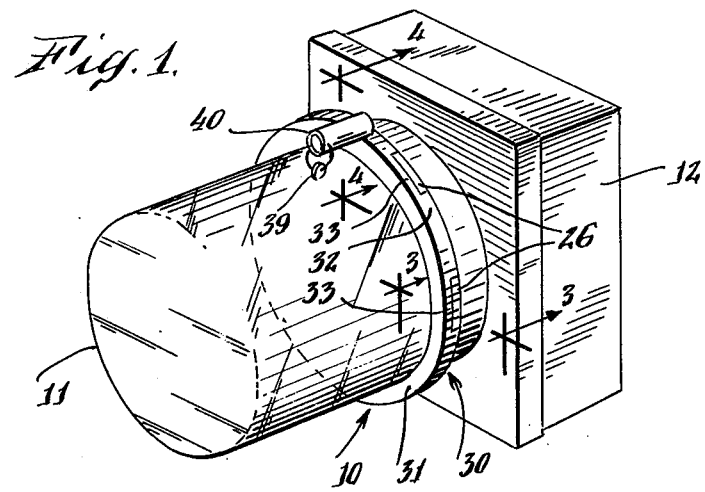
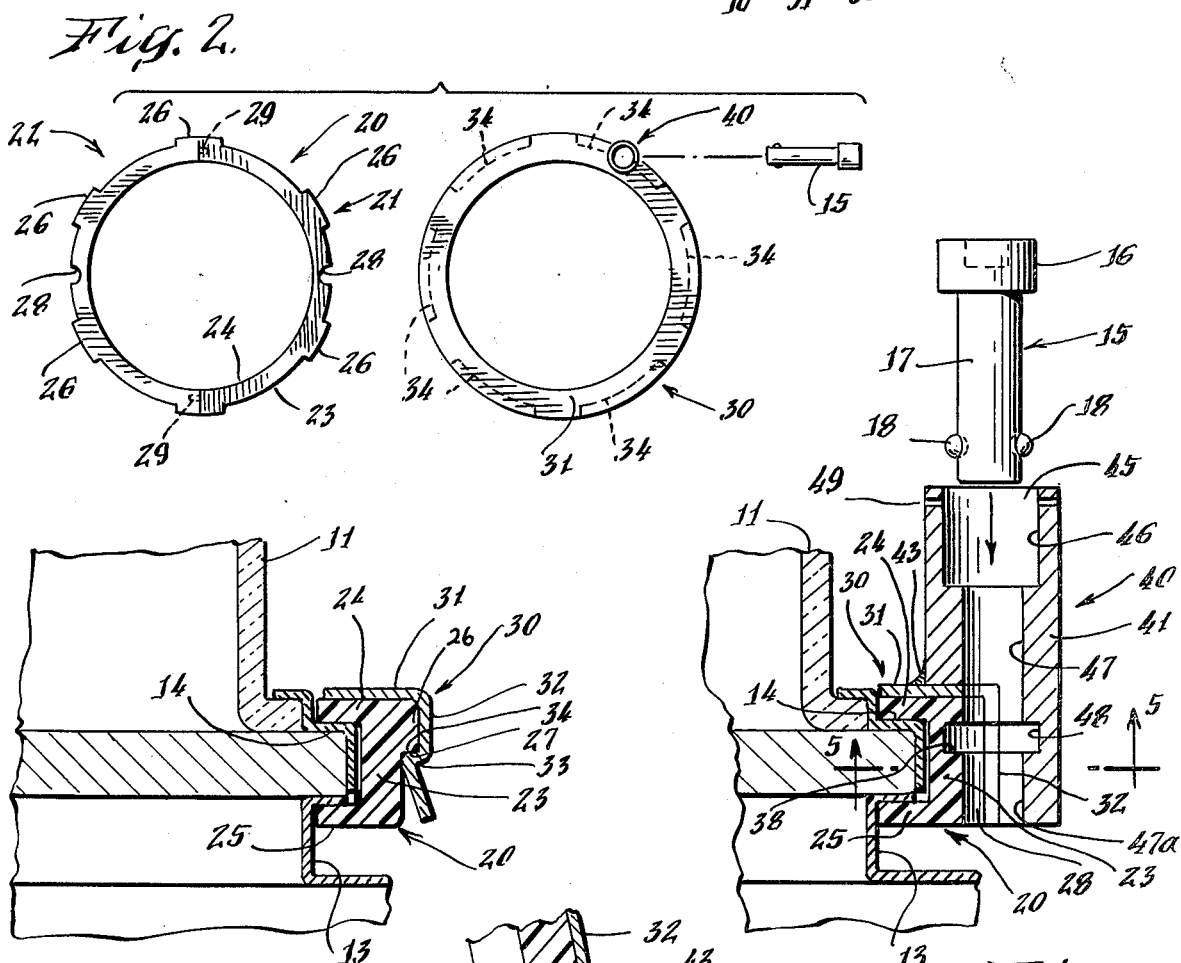

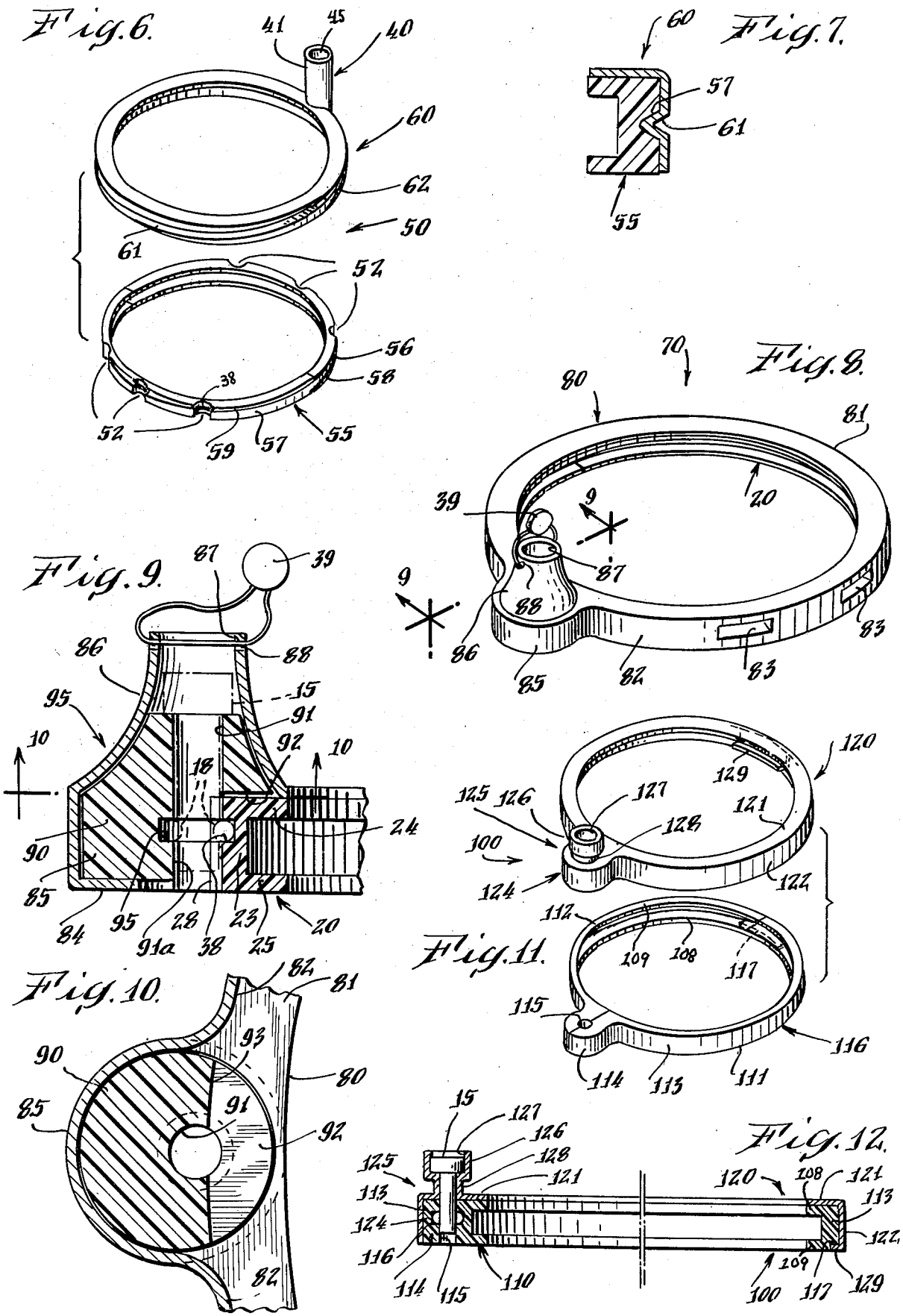

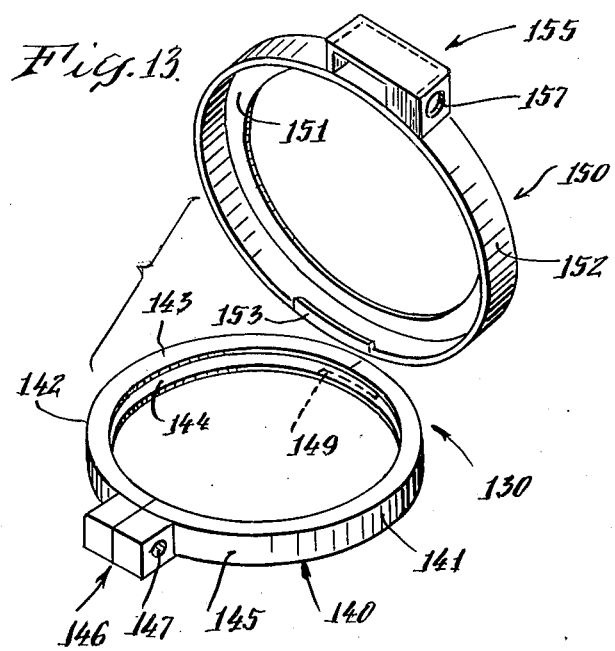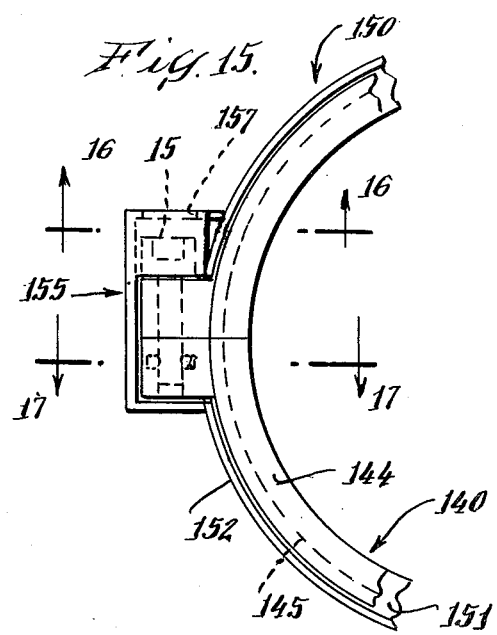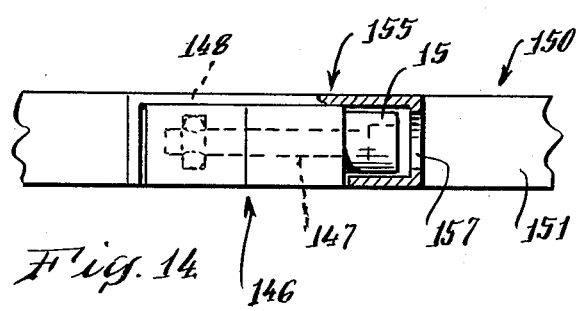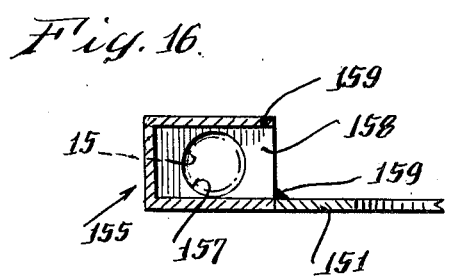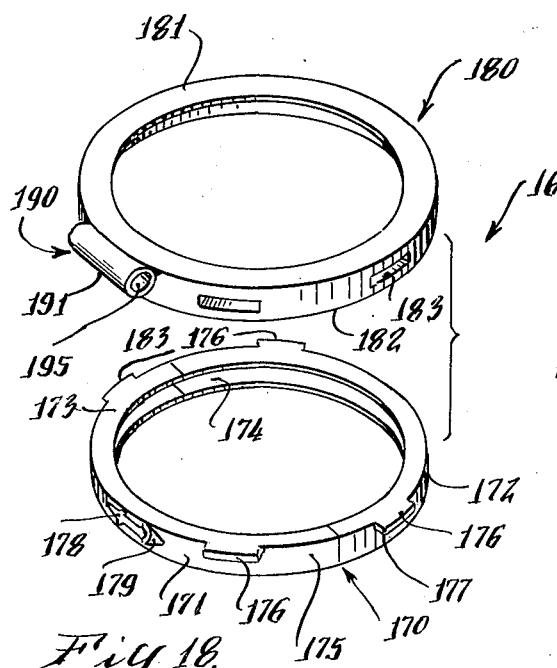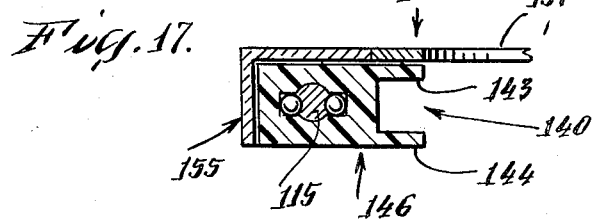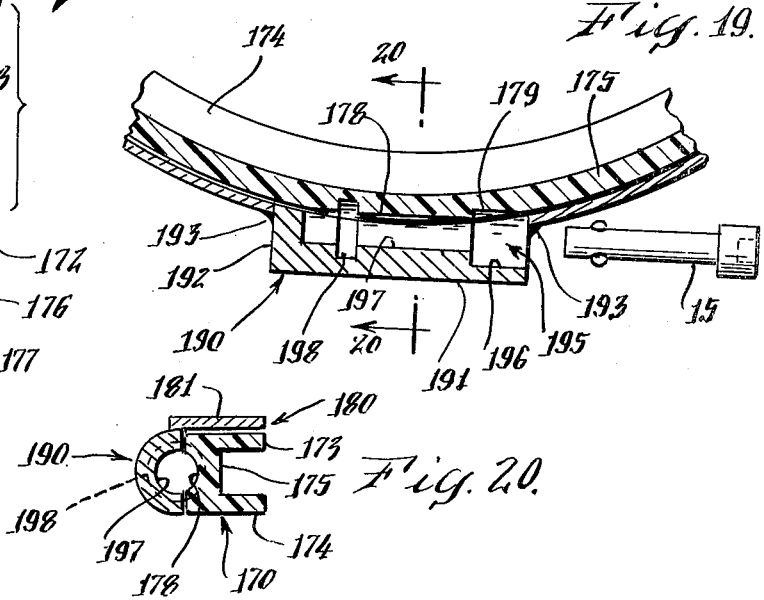

LOCKABLE METER RETENTION RING

BACKGROUND OF THE INVENTION

This invention relates to a lockable meter retention ring, and more particularly to a meter retention ring for securing a meter in a meter box and adapted to receive a lock preventing the removal of the meter retention ring, thereby protecting the meter against tampering.

Electric meters are connected in power lines supplying electrical power to buildings, the electrical meters measuring the amount of power supplied. A meter box is provided which contains a set of terminals in the power line, and the electric meter plugs into the terminals, connecting them and measuring the current flow through the power line. The meter box defines a groove adjacent the periphery of the electric meter, and the meter itself defines a shoulder along its periphery adjacent the meter box.

Low-security protection against electric meter tampering is often provided by a steel split ring having inwardly disposed parallel flanges, the inner one of which is accepted in the peripheral groove in the meter box and the outer one of which fits over the shoulder of the electric meter, thereby securing the electric meter in the meter box. The steel split ring also comprises two protruding end portions which are secured together by a machine screw. A seal, such as a wire/lead or wire/plastic seal, is passed through openings in the ends of the steel split ring. In order to remove or tamper with the electric meter, the seal has to be broken, and this should be detected by a meter reader through periodic inspection. However, simple seals have proven to be inadequate protection against theft of electric power through tampering with electric meters. The seals can be discreetly severed in ways that are not apparent without close inspection, or can be forcibly removed and replaced with stolen or counterfeit seals prior to inspection by a meter reader. As the cost of electricity escalates, more people are tempted to tamper with electric meters to avoid paying for the entire amount of electrical power used. In addition, the monetary losses to utilities for each unit of electrical power which is not billed and paid for because of electric meter tampering also escalates.

In view of the foregoing problems, various devices for locking the steel split ring in its position securing the electric meter to the meter box were developed. One such locking device is shown in Morse U.S. Pat. No. 3,867,822, the device comprising a pendant-like yoke which fits over the protruding ends of the split ring and receives a barrel lock that passes through openings in the ends of the split ring to retain the yoke thereon. The yoke encloses ends of the split ring and the machine screw holding the ends of the split ring together, as well as the lock itself, whereby the ring cannot be removed. Another similar device is shown in Lundberg U.S. Pat. No. 4,008,585. Further improvements to such locking devices have included providing a front entry opening for the barrel lock, thereby simplifying installation of the locking device in multiple meter installations as well as providing for easier inspection of the integrity of the locking device.

However, all of the devices which enclose the split ends of the traditional meter retention ring are somewhat cumbersome and expensive to make, and are essentially add-on devices. They have, by necessity of their design, cracks between the ring and the yoke which can be attacked with pry bars to remove the devices. The split rings themselves cannot be as strong as would be desirable because they must be spread to fit them over the meter, and stronger steels are incompatible with this requirement. Therefore, the prior art devices have been less than satisfactory in many respects.

One other prior art device is pertinent to this application, namely an electric meter seal which comprises a two-piece plastic flanged collar which assembles together to form an inner meter retention ring, and a plastic outer ring which snaps over the two-piece plastic collar. The outer ring holds the two-piece plastic flanged collar together, thereby retaining the electric meter in the meter box. The plastic outer ring is breakable and must be broken in order to disassemble the two-piece plastic collar and free the electric meter for removal. Thus, this device is very much more in the nature of a seal than a lock, is easily defeated by force, and also offers opportunity for being surreptitiously removed or removed and replaced with stolen or unauthorized parts.

Accordingly, there is a need for an improved means for securing an electric meter in an associated meter box so that tampering with the electric meter by force or stealth is made highly difficult.

SUMMARY OF THE INVENTION

It is a principal object of the invention herein to provide improved security for electric meters.

It is an additional object of the invention herein to provide an improved device for securing and locking electric meters to associated meter bases.

It is a further object of the invention herein to provide a lockable meter retaining ring which may be manufactured at low cost, is rugged, and is highly resistant to tampering or unauthorized removal.

It is an additional object of the invention herein to provide a lockable meter retention ring of compact and clean design.

A lockable meter retention ring assembly according to the invention herein comprises a two-piece flanged collar which is assembled together to form an inner ring for retaining an electric meter in a meter box and a steel outer ring which fits over the inner ring, thereby holding the two pieces of the inner ring assembled together. The inner ring and outer ring when assembled together define an opening for receiving a lock, which is preferably of the barrel lock type commonly used by utility companies. The barrel lock is substantially received in a lock enclosure forming a part of the outer ring. The barrel lock prevents removal of the outer ring from the inner ring, whereby meter retention ring assembly maintains the electric meter secured in its meter box. The lock-receiving opening may be oriented such that the lock is inserted from the front, i.e. facing the electric meter, and the lock is fully enclosed with its top surface available for inspection, or may be oriented generally tangent to the ring which provides a compact assembly. Additionally, the opening can be provided with a seal, which is also readily inspectable. The lockable meter retention ring assembly, including the lock-receiving portion thereof, is compact and clean in design, with the lock being positioned closely adjacent to the electric meter. It is strong and highly tamper-resistant.

In some embodiments, the inner ring and outer ring are secured together in bayonet engagement, i.e. the inner ring has spaced-apart flanges on its outer periphery and the outer ring also has spaced-apart flanges which fit between the flanges of the inner ring and are positioned under the flanges of the inner ring by rotation. Alternatively, the outer ring is threaded onto the inner ring. The barrel lock is partially received in a notch in the inner ring and partially received in the lock enclosure of the outer ring, thereby preventing the relative rotation of the two rings necessary to remove the lockable meter retention ring assembly. In other embodiments, the outer ring has a flange which engages with the inner ring, and the barrel lock is received in an opening generally diametrically opposite the flange engagement. The barrel lock secures the outer ring against the tipping motion necessary to disassemble the lockable meter retention ring assembly.

Other and more specific objects and features of the invention herein will in part be obvious and will in part appear from a perusal of the following description of preferred embodiments and claims taken together with the drawings.

DRAWINGS

FIG. 1 is a perspective view of a lockable meter retention ring assembly according to the invention herein securing an electric meter to an associated meter box;

FIG. 2 is a front elevation view of the lockable meter retention ring assembly of FIG. 1 disassembled into its component parts;

FIG. 3 is a fragmentary sectional view of the lockable meter retention ring assembly and the electric meter and meter box taken along the lines 3—3 of FIG. 1;

FIG. 4 is a fragmentary sectional view of the lockable meter retention ring assembly taken generally along the lines 4—4 of FIG. 1;

FIG. 5 is a fragmentary sectional view of the lockable meter retention ring assembly taken along the lines 5—5 of FIG. 4;

FIG. 6 is a perspective view of the component parts of another lockable meter retention ring assembly according to the invention herein;

FIG. 7 is a fragmentary sectional view of the lockable meter retention ring assembly of FIG. 6 with the component parts assembled together;

FIG. 8 is a perspective view of another lockable meter retention ring assembly according to the invention herein;

FIG. 9 is a fragmentary sectional view of the lockable meter retention ring assembly of FIG. 8 taken along the lines 9—9 of FIG. 8;

FIG. 10 is a fragmentary bottom view of the lock-receiving portion of the outer ring of the lockable meter retention ring assembly of FIG. 8;

FIG. 11 is a perspective view of the component parts of another lockable meter retention ring assembly according to the invention herein;

FIG. 12 is a sectional view of the lockable meter retention ring assembly of FIG. 11 with the component parts thereof assembled together;

FIG. 13 is a perspective view of another lockable meter retention ring assembly according to the invention herein;

FIG. 14 is a fragmentary bottom view of the lockable meter retention ring assembly of FIG. 13;

FIG. 15 is a sectional view of the lockable meter retention ring assembly of FIG. 13 taken along the lines 15—15 of FIG. 14;

FIG. 16 is a sectional view of the lockable meter retention ring assembly of FIG. 13 taken along the lines 16—16 of FIG. 14;

FIG. 17 is a sectional view of the lockable meter retention ring assembly of FIG. 13 taken along the lines 17—17 of FIG. 14;

FIG. 18 is a perspective view of another lockable meter retention ring assembly according to the invention herein;

FIG. 19 is a sectional view of the lockable meter retention ring assembly of FIG. 18 taken along the lines 19—19 of FIG. 20; and FIG. 20 is a sectional view of the lockable meter retention ring assembly of FIG. 18 taken along the lines 20—20 of FIG. 19.

The same reference numerals refer to the same elements throughout the various Figures.

DESCRIPTION OF PREFERRED EMBODIMENTS

With reference to FIGS. 1-5, a lockable meter retention ring assembly 10 is illustrated as a first embodiment of the invention herein. The meter retention ring assembly 10 is shown securing an electric meter 11 to a meter box 12. The meter retention ring assembly 10 generally comprises an inner ring 20 consisting of two identical pieces 21 and 22, and an outer ring 30 including a lock enclosure 40 which receives a conventional barrel lock 15 for securing the inner ring and outer ring together. When describing the meter retention ring assemblies, the term "front" shall be the direction toward the outer end of the electric meter 11 and the term "rear" shall be the direction more closely adjacent the meter box 12.

The inner ring 20 is formed in two pieces 21 and 22, which may be identical for ease of fabrication and which are preferably fabricated of a strong plastic material, such as Lexan ®, or of metal, such as steel. Each of the pieces 21 and 22 are semicircular, and assembled together to form the complete inner ring 20. As best seen in FIGS. 3 and 4, the inner ring 20 has a cylindrical wall 23, and parallel spaced-apart flanges 24 and 25 extend inwardly from the cylindrical wall 23. The rear flange 25 is received in a groove 13 defined by the meter box 12 about the periphery of the meter opening thereof, and the upper flange 24 overlays the marginal ledge 14 of the electric meter 11, whereby the inner ring 20 serves to retain the electric meter 11 in the meter box 12.

The outer ring 30 and inner ring 20 are securable together via bayonet-type engagement. For that purpose, the inner ring 20 further comprises a plurality of spaced-apart flanges 26 extending outwardly from the cylindrical wall 23. In the embodiment shown, there are six flanges 26. The circumferential spacing between adjacent flanges 26 preferably is about the same or slightly greater than the circumferential length of the flanges themselves. The flanges 26 form a lip 27 on the underside thereof, as best seen in FIG. 3. The inner ring 20 also defines at least one partial cylindrical notch 28, which is formed in the outer surface of sidewall 23, the notch 28 forming a portion of a lock-receiving opening as will be more fully discussed below. Since the inner ring 20 is preferably formed in two identical pieces 21 and 22 for economy of molding, there are two notches 28. The pieces 21 and 22 of the inner ring 20 may include a pin-in-opening arrangement, generally illustrated at 29, for securing the halves 21 and 22 together prepatory to receiving the outer ring 30, and this feature is also employed in later embodiments.

The outer ring 30, which is preferably fabricated of a strong hardened steel, is generally L-shaped in section having an annular front wall 31 which covers the front (including the front flange 24) of the inner ring 20 and a cylindrical depending sidewall 32, which generally covers the sidewall 23 of the inner ring 20. The cylindrical sidewall 32 of the outer ring 30 has a plurality of depressions 33 formed therein at evenly spaced-apart intervals about the periphery, each of the depressions 33 forming a lip 34. It will be appreciated that the circumferential dimension of the depressions 33 and associated lips 34 is such that they will pass through the spaces between the radially outwardly protruding flanges 26 of the inner ring 20, whereby the outer ring 30 may be fit over the inner ring 20. Rotation of the outer ring 30 relative to the inner ring 20 positions the respective lips 34 of the outer ring under the lips 27 of the inner ring, whereby the outer ring cannot be removed from the inner ring except by reversal of the bayonet engagement process.

The lockable meter retention ring assembly 10 further comprises a lock enclosure 40. The lock enclosure 40 is secured to and, therefore, a part of the outer ring 30, the lock enclosure 40 serving to receive and retain, when locked, a conventional barrel lock 15 wherein the barrel lock 15 prevents the outer ring 30 from being removed from the inner ring 20. The lock enclosure 40 comprises generally a cylindrical body 41 which is partially cut away or "notched" at one end to receive the inner ring 20. The lock enclosure 40 is also fabricated of steel and is secured to the outer ring by welds, as indicated at 43. The lock enclosure 40 defines a lock-receiving opening generally indicated at 45. The lock-receiving opening 45 has an upper portion 46 of a diameter for receiving the head 16 of the barrel lock 15 and a lower portion 47 of a diameter to receive the shank 17 of the barrel lock 15. As best seen in FIGS. 4 and 5, a part 47a of the lower portion 47 of the lock-receiving opening 45 intersects the cylindrical sidewall 32 of the outer ring 30, as well as a portion of the front wall 31 of the outer ring 30, and portions of the outer ring 30 are cut away to form the lock-receiving opening 45. It will be appreciated that the part 47a of the lock-receiving opening 45, where the lock enclosure is notched and attached to the outer ring 30, is not completely cylindrical in and of itself. An annular groove 48 is formed in the part 47a of the lock-receiving opening 45, the annular groove 48 being positioned to receive at least one of the expansible locking balls 18 of the barrel lock 15 in order to retain the barrel lock in the lock enclosure. In the preferred embodiment, the part 47a defines approximately two-thirds of a complete cylindrical opening, assuring that at least one and perhaps both of the locking balls 18 will be received in the annular groove 48.

The outer ring 30 is fit over the inner ring 20 and rotated to achieve bayonet engagement with the lock enclosure 40, and more particularly the lock-receiving opening 45 thereof, aligned with one of the notches 28 in the inner ring 20. The notch 28 defines the remainder of the cylindrical lock-receiving opening, and has an annular groove 38 aligned with the annular groove 48 of the lock housing, the annular groove 38 also serving to receive one of the expansible locking balls 18 of the barrel lock 15 (depending on the orientation of the barrel lock 15). Thus, when the barrel lock 15 is inserted into the lock-receiving opening and locked, it is retained therein by the engagement of the locking balls 18 in the annular grooves 38 and 48. The shank 17 of the barrel lock 15 substantially fills the lock-receiving opening and particularly the part 47a thereof, the shank of the barrel lock extending into the notch 28 of the inner ring 20. Therefore, the outer ring 30 cannot be rotated with respect to the inner ring 20 to release the bayonet engagement, and the outer ring 30 is secured on the inner ring 20.

The lock enclosure 40 may be provided with two aligned slot openings 49 at the upper end thereof, the slot openings 49 being positioned above the head of the barrel lock 15 when the barrel lock is inserted in the lock enclosure. As best seen in FIG. 1, a seal 39 may be inserted through the slot openings 49 to provide secondary protection against and evidence of unauthorized removal of the lock and consequent tampering with the electric meter.

With reference to FIG. 1, in which the lockable meter retention ring assembly 10 is shown securing the electric meter 11 to the associated meter box 12, it will be noted that the lock enclosure 40 is positioned closely adjacent the electric meter 11. Thus, the lockable meter retention ring assembly 10 exhibits a very compact design suitable for use in multiple electric meter installations where the spacing between the adjacent electric meters is small. Also, the lock-receiving opening is generally perpendicular to the meter box and parallel to the cylindrical wall of the electric meter, providing "front" entry of the lock. This is also highly advantageous in multiple electric meter installations, and in addition, provides for easy inspection of the integrity of the lock and/or the seal at the end of the lock-receiving opening.

With reference to FIGS. 6 and 7, another lockable meter retention ring assembly 50 according to the invention herein is illustrated. The lockable meter retention ring assembly 50 also comprises an inner ring 55 formed of two parts 56 and 57, and an outer ring 60 including a lock enclosure 40, which may be the same as the lock enclosure described above. The lockable meter retention ring assembly 50 differs from the lockable meter retention ring 10 described above in that the outer ring 60 is secured to the inner ring 55 by means of screw thread engagement rather than by bayonet engagement. To this end, the pieces 56 and 57 comprising the inner ring 55 are respectively provided with screw threads 58 and 59. The steel outer ring 60 also has screw threads 61 and 62 formed in the cylindrical outer wall thereof for mating with the screw threads of the inner ring. Thus, the outer ring may be screwed on to the inner ring to assemble the two rings together, as illustrated in FIG. 7. The inner ring 55 also defines a plurality of notches 52 on the cylindrical sidewall thereof, these notches 52 being the same as the notches 28 in the inner ring 20 described above. As previously mentioned, the lock enclosure 40 may be the same as described above, and defines a lock-receiving opening 45. Thus, when the outer ring 60 is threaded on to the inner ring 55, the lock-receiving opening 45 of the lock enclosure 40 is positioned adjacent one of the notches 52 in the inner ring, the notch in the inner ring serving to complete definition of the lock-receiving opening. A barrel lock 15 is inserted into the lock-receiving opening and secured therein by its expansible locking balls. The engagement between the shank of the barrel lock, the lock enclosure 40 and the notch 52 of the inner ring serves to prevent the outer ring from being rotated relative to the inner ring, thereby securing the outer ring on the inner ring. This provides a strong meter retention ring assembly 50 which cannot be disassembled without removal of the barrel lock, and which has the advantageous features noted above.

FIGS. 8–10 show another lockable meter retention ring assembly 70 according to the invention herein. The meter retention ring assembly 70 comprises an inner ring 20 (the same as the inner ring 20 of the meter retention ring 10 described above) and a steel outer ring 80 characterized by a lobe 85. The steel outer ring 80 has a front wall 81 and a depending cylindrical sidewall 82, the depending cylindrical sidewall 82 being provided with a plurality of evenly spaced-apart depressions 83 forming lips at the top thereof, whereby the steel outer ring 80 fits over and engages the inner ring 20 in bayonet fashion, similar to the outer ring 30 of the meter retention ring assembly 10 described above.

The lobe 85 and a lobe insert 90, described below, form the lock enclosure 95 of the meter retention ring assembly 70. The lobe 85 comprises an enlarged portion of the front wall 81 formed into a generally conical upstanding projection 86 having a front facing end opening 87. The cylindrical sidewall 82 extends outwardly in the vicinity of the lobe 85 to depend from the conical projection 86. The lobe insert 90 is positioned inside the lobe 85, being retained therein by an inturned flange 84 at the lower edge of the sidewall, or by other suitable means. The lobe insert 90 defines an opening 91 for receiving the shank of a barrel lock, the head of the barrel lock being received above the lobe insert 90 and within the conical projection 86, as best seen in FIG. 9. The lobe insert 90 is cut away, as best seen in FIGS. 9 and 10, thereby having a ledge 92 and a vertical wall 93 intersecting the lower portion 91a of the opening 91.

The inner ring 20 is received in the cut away portion of the lobe insert 90, and when the outer steel ring 80 is assembled on the inner ring 20, one of the notches 28 is positioned with respect to the lobe insert to complete definition of the lock-receiving opening. The lobe insert 90 further defines an annular groove 94 which cooperates with the annular groove 38 in the notch 28 of the inner ring to receive the expanded locking balls of the barrel lock 15. Thus, when the barrel lock is so received in the lock enclosure 95 of the outer ring 80, the outer ring 80 is prevented from being rotated relative to the inner ring 20 and the bayonet engagement holds the inner ring and outer ring together. The meter retention ring assembly 70 provides front entry for the barrel lock, and is relatively compact. The outer ring 80 including the lobe 85 with its conical projection 86, provide a relatively smooth exterior surface which resists attack by pry bars and the like. The barrel lock 15 is fully enclosed, and the seal 39 may be provided at the upper open end 87 of the conical projection 86 through slots 88 if desired.

With reference to FIGS. 11 and 12, another lockable meter retention ring assembly 100 is illustrated. It generally comprises an inner ring 110 and an outer ring 120 which are be secured together by a barrel lock 15. The inner ring 110 itself comprises two generally semi-circular parts 111 and 112, which are mirror images of each other and assembled together to form the complete inner ring 110. A cylindrical sidewall 113 of the inner ring 110 has spaced apart front and rear inwardly projecting flanges 108 and 109, the rear flange being received in the groove of a meter box 12 and the front flange retaining the electric meter 11 therein. The cylindrical sidewall 113 expands into a lobe 114, which defines an opening 115 for receiving the shank 17 of barrel lock 15, as shown in FIG. 12. The opening 115 defines an annular groove 116 which receives the expanded locking balls of the barrel lock to retain the barrel lock therein. It will be noted that the intersection of the two parts 111 and 112 may intersect the opening 115. On the opposite side of the inner ring 110 from the lobe 114, a notch 117 is defined on the underside of the cylindrical sidewall 113. The notch 117 extends along a portion of the circumference of the inner ring 110, and in particular extends across the joint between the two parts 111 and 112 thereof.

The outer ring 120 has a front wall 121 and a generally cylindrical depending sidewall 122. The front and sidewalls expand into a lobe 124 having an open ended projection 126, the lobe and projection forming a lock enclosure 125 of the outer ring 120. The lobe 124 of the steel outer ring 120 is shaped to fit over and receive the lobe 114 of the inner ring 110 with the end opening 127 of the conical projection 126 aligned with the opening 115 in the inner ring, these two openings together defining a lock-receiving opening for a barrel lock 15. It will be noted that the conical projection 126 is necked in at 128 to provide a flange above which the head of the barrel lock rests. Opposite the lock enclosure 125, the steel outer ring 120 is provided with a flange 129, the flange 129 extending inwardly from the bottom of the cylindrical sidewall 122. This flange 129 is received in the notch 117 of the inner ring 110.

Accordingly, the lockable meter retention ring assembly 100 is installed by first assembling the two portions 111 and 112 of the inner ring 110 with the front and rear flanges 108 and 109 holding the electric meter to the meter box. The steel outer ring 120 is fit over the inner ring 110 by first inserting the flange 129 in the notch 117 and then tilting the outer ring downwardly to fit the lobe 124 of the outer ring over the lobe 114 of the inner ring. A barrel lock is inserted in the lock-receiving opening and locked, expanding its locking balls into the annular groove 116, whereafter the outer ring cannot be removed from the inner ring. This fully secures the electric meter in the associated meter box.

With reference to FIGS. 13–17, another lockable meter retention ring assembly 130 according to the invention herein is illustrated. The lockable meter retention ring assembly 130 is characterized by the barrel lock being received in the lock-receiving opening of a lock enclosure disposed generally tangential to the inner and outer rings, as more fully discussed below, which provides a highly compact design with minimal protrusion of the lock enclosure.

More particularly, the lockable meter retention ring assembly 130 generally comprises an inner ring 140 and an outer ring 150 including a lock enclosure 155. The inner ring 140 is fabricated in two parts 141 and 142, so that it may be fit onto the electric meter and the associated meter box. The inner ring 140 has spaced-apart inwardly extending front and rear flanges 143 and 144 connected by a cylindrical sidewall 145, and the flanges 143 and 144 serve to retain the electric meter in the meter box. The inner ring 140 further comprises a lobe 146 extending radially outwardly from the cylindrical sidewall 145, the lobe 146 defining an opening 147 disposed generally tangential to the circumference of inner ring 140 and sized to receive the shank of a barrel lock 15. The length of the lobe 146 and the opening 147 therein is preferably about the same as the shank of the barrel lock 15, as best seen in FIGS. 14 and 15. The opening 147 has an annular groove 148 which receives the expansible locking balls of the barrel lock 15 in order to retain the barrel lock therein. The inner ring 140 further defines a peripheral notch 149 extending along the rear of the cylindrical sidewall 145, generally diametrically opposite from the lobe 146. The division between the two pieces 141 and 142 comprising an inner ring 140 preferably passes through both the notch 149 and the lobe 146 so that the outer ring engages both pieces 141 and 142, as described below, and the shank of the barrel lock also extends across the division between the pieces 141 and 142. The inner ring 140 may be fabricated of a high strength plastic, or may be fabricated of metal if desired.

The outer ring 150 has an annular front wall 151, which covers the front flange 143 of the inner ring 140, and a cylindrical depending sidewall 152 which lies adjacent the sidewall 145 of the inner ring when the two rings are assembled together. The outer ring 150 further comprises an inturned flange 153 at the rear of the cylindrical sidewall 152, the flange 153 being received in the notch 149 of the inner ring 140 when the inner and outer rings are assembled together. The outer ring 150 has an integral lock enclosure 155 projecting outwardly from the cylindrical sidewall 152 opposite the flange 153. The lock enclosure 155 fits over and receives the lobe 146 of the inner ring 140 and the lock enclosure defines an opening 157 which aligns with the opening 147 of the lobe 146 to complete definition of the lock-receiving opening for the lockable meter retention ring assembly 130. The outer ring 150 is preferably formed of stamped steel, and it is convenient to weld a portion of metal stock 158 defining the opening 157 to the interior of the lock enclosure 155, the welds being indicated at 159. The stamped steel may be turned under to form a bottom of the lock enclosure under the piece 158, as illustrated in FIGS. 14–16, but the remaining under side of the lock enclosure 155 is open, as best seen in FIGS. 14 and 15. Thus, the lockable meter retention ring assembly 130 is installed by first fitting the two pieces 141 and 142 of the inner ring around the electric meter and the associated lip of the meter box, and then engaging the flange 153 of the outer ring in the notch 149 of the inner ring and pivoting the outer ring downwardly over the inner ring, with the lobe 146 being received in the lock enclosure 155. The barrel lock 15 is then inserted into the lock-receiving opening and its locking balls expanded into the annular groove 148 to retain the barrel lock therein. This prevents the outer ring from being lifted off the inner ring, thereby securing the outer ring and inner ring together whereby the lockable meter retention ring assembly 130 holds the electric meter in its associated meter box.

Another lockable meter retention ring assembly 160 is shown in FIGS. 18–20, and generally comprises an inner ring 170, an outer ring 180 and a lock enclosure 190 secured to and forming a part of the outer ring 180. The inner ring 170 may be fabricated of plastic and is formed in two parts 171 and 172 so that it may be assembled over the electric meter and the associated meter box. The inner ring 170 has a front flange 173 and a rear flange 174 connected by a cylindrical sidewall 175, the flanges serving to retain the electric meter in its meter box. The inner ring 170 and the outer ring 180 of the lockable meter retention ring assembly 160 secure together in bayonet engagement, similar to that of the lockable meter retention ring assembly 10 described above. Accordingly, the inner ring 170 has a plurality of spaced-apart outwardly protruding flanges 176 forming lips 177 at their lower edges. The inner ring 170 further defines a first partial cylindrical notch 178 disposed tangentially along the circumference thereof and a second larger diameter partial cylindrical notch 179 also disposed tangentially along the circumference of the inner ring adjacent the first notch. These partial cylindrical notches define a portion of the lock-receiving opening of the lockable meter retention ring assembly 160 and, respectively, receive portions of the shank and head of a barrel lock 15, as best illustrated in FIGS. 19 and 20.

The outer ring 180, which is fabricated of steel, has an annular front wall 181 and a depending cylindrical sidewall 182. Spaced-apart depressions 183 are formed in the sidewall 182, and the depressions 183 form upwardly disposed lips (not shown) on the interior of the cylindrical sidewall 182, whereby the outer ring may be placed over the inner ring and rotated to engage the lips of the depressions 183 with the lips of the radially outwardly extending flanges 176 to secure the inner ring and outer ring together in bayonet engagement.

The lockable meter retention ring assembly 160 further comprises a lock enclosure 190, the lock enclosure 190 comprising a partial cylindrical sidewall 191 and an end wall 192 and defining a partially cylindrical lock-receiving opening 195. With reference to FIG. 19, which shows a longitudinal section through the lock enclosure 190, it can be seen that the lock enclosure 190 may be fabricated by milling an arcuate portion from a complete cylindrical section of stock. The cylindrical sidewall 182 of the outer ring 180 is cut away to receive the lock enclosure 190, and the two are joined by welds 193. The lock-receiving opening 195 of the lock enclosure includes a large diameter portion 196 for receiving the head of the barrel lock 15 and a smaller diameter portion 197 for receiving the shank of the barrel lock 15 with an annular groove 198 provided to receive the locking balls of the barrel lock 15. As best seen in FIGS. 19 and 20, the opening 195 in the lock enclosure and the partial cylindrical notches 178 and 179 in the inner ring 179 together form a complete lock-receiving opening for the barrel lock 15, and the engagement of the barrel lock 15 in the notches 178 and 179 prevents relative rotation of the outer ring 180 with respect to the inner ring 170 thereby securing the lockable meter retention ring assembly 160 together. It will be apparent from FIGS. 18–20 that the lockable meter retention ring assembly 160 is quite compact, and is suitable for installation on electric meters deployed in multiple meter installations where space is at a premium. The structure is also exceptionally strong and offers little opportunity for successful attack by force.

There have been described above several preferred embodiments which admirably achieve the objects of the invention herein and, more particularly, provide strong, compact, lockable meter retention ring assemblies. It will be appreciated, however, that various changes could be made from the preferred embodiments described above without departing from the spirit and scope of the invention. For instance, the inner rings could be made of more than two arcuate parts, and the inner rings could be fabricated of steel rather than plastic for an exceptionally high strength installation. Also, the lobe inserts described above could take a variety of forms, and could comprise a metal ferrule defining a lock-receiving opening and secured such as by welding within the lobe. Additionally, although the lock itself is shown effecting an engagement between the outer and inner rings, it will be appreciated that some other locking member might be utilized for this purpose and the lock then be utilized to hold such a locking member in place. Accordingly, the invention is limited only by the following claims.

I claim:

1. A lockable meter retention ring assembly for securing an electric meter to an associated meter box, the assembly comprising an inner ring, a metal outer ring, and a lock enclosure, (A) the inner ring being comprised of at least two arcuate parts assembled together to form a complete ring having spaced apart front and rear flanges extending inwardly from a generally cylindrical sidewall, the inner ring defining at least a portion of an opening for receiving locking means and the inner ring being adapted for engaging with the outer ring, (B) the outer ring being fabricated of metal and having an annular front for covering the front flange of the inner ring and a depending cylindrical sidewall for closely surrounding the sidewall of the inner ring, the outer ring being adapted to fit over and engage with the inner ring thereby preventing separation of the parts of the inner ring and retaining the electric meter in the associated meter box and (C) the outer ring carrying a lock enclosure having an opening which defines, with the opening in the inner ring, the opening for receiving the locking means and for retaining the locking means when it is locked, the locking means securing the outer ring and inner ring together for preventing disassembly of the outer ring from the inner ring, wherein the locking means is a barrel lock of the type having a head, shank, and expansible locking balls, and the opening receiving the locking means is shaped and dimensioned to receive the barrel lock and to retain it when the balls are in the expanded position.

2. The lockable meter retention ring assembly as defined in claim 1 wherein the inner ring and outer ring are engaged together by means of screw threads.

3. The lockable meter retention ring assembly as defined in claim 2 wherein the inner ring has means forming two threads and the metal outer ring has two corresponding inwardly protruding threads for engagement with said first-mentioned threads.

4. The lockable meter retention ring assembly as defined in claim 3 wherein the portion of the lock-receiving opening defined by the inner ring comprises a notch in the cylindrical sidewall positioned adjacent the lock enclosure when the inner ring and outer ring are engaged together, the shank of the barrel lock being partially received in the notch and partially received in the lock enclosure, whereby the shank of the barrel lock prevents relative rotation of the inner ring and outer ring and thereby maintains the inner ring and outer ring in their threaded engagement.

5. The lockable meter retention ring assembly as defined in claim 1 wherein the barrel lock is received in the lock-receiving opening from the front of the outer ring.

6. The lockable meter retention ring assembly as defined in claim 1 wherein the barrel lock is received in an opening disposed generally tangentially to the outer ring.

7. The lockable meter retention ring assembly as defined in claim 1 wherein the inner ring is fabricated of two substantially semi-circular pieces which fit together to form the complete inner ring.

8. The lockable meter retention ring assembly as defined in claim 7 wherein the inner ring is fabricated of plastic.

9. The lockable meter retention ring assembly as defined in claim 1 wherein the inner ring comprises a plurality of spaced-apart flanges extending outwardly from the cylindrical sidewall thereof, and the outer ring has a plurality of inwardly extending flanges which fit between the flanges of the inner ring and are positioned under the flange of the inner ring by relative rotation of the two rings, whereby the inner ring and the outer ring are secured together by a bayonet engagement.

10. The lockable meter retention ring assembly as defined in claim 9 wherein the flanges of the outer ring comprise inwardly deformed portions of the cylindrical sidewall.

11. The lockable meter retention ring assembly as defined in claim 9 wherein the portion of the lock-receiving opening defined by the inner ring comprises a notch in the cylindrical sidewall positioned adjacent the lock enclosure when the inner ring and outer ring are engaged together, the shank of the barrel lock being partially received in the notch and partially received in the lock enclosure, whereby the shank of the barrel lock prevents relative rotation of the inner ring and outer ring and thereby maintains the inner ring and outer ring in their bayonet engagement.

12. The lockable meter retention ring assembly as defined in claim 11 wherein the lock enclosure comprises an enlarged lobe of the outer ring having an open-ended generally conical projection, the open-ended conical projection comprising the front entry of the lock-receiving opening, and a lobe insert secured in the lobe of the steel outer ring, the lobe insert adapted to receive the inner ring and defining a portion of the lock-receiving opening together with the notch of the inner ring.

13. The lockable meter retention ring assembly as defined in claim 11 wherein the lock enclosure comprises a generally cylindrical metal housing welded to the outer ring, the cylindrical housing being cut away to receive the periphery of the inner ring with the notch formed therein defining the lock-receiving opening together with the lock enclosure.

14. The lockable meter retention ring assembly as defined in claim 13 wherein the lock enclosure and the inner ring define an annular groove for receiving the expansible locking balls of the barrel lock, approximately two-thirds of the annular groove being defined by the metal housing and approximately one-third of the annular groove being defined by the plastic inner ring, whereby at least one and sometimes both of the locking balls are received by the portion of the annular groove formed by the metal housing.

15. The lockable meter retention ring assembly as defined in claim 13 wherein the generally cylindrical metal housing is disposed perpendicularly with respect to the plane of the outer ring and has a lower portion cut away to receive the periphery of the inner ring, whereby the barrel lock is received in the lock-receiving opening from the front of the outer ring.

16. The lockable meter retention ring assembly as defined in claim 13 wherein the generally cylindrical metal housing is disposed generally tangentially with respect to the outer ring and has an arcuate longitudinal portion cut away to receive the periphery of the inner ring, and the notch in the inner ring is formed along the circumference thereof, whereby the lock-receiving opening and the barrel lock received therein are disposed generally tangentially to the outer ring.

17. The lockable meter retention ring assembly as defined in claim 16 wherein the inner ring defines a second larger diameter notch adjacent the first notch, the second notch also defining a portion of the lock-receiving opening which receives a portion of the head of the barrel lock.

18. The lockable meter retention ring assembly as defined in claim 1 wherein the inner ring has a lobe defining a portion of the lock-receiving opening, the outer ring has a flange which engages the inner ring opposite the lobe of the inner ring and the lock enclosure comprises a lobe of the outer ring which fits over the lobe of the inner ring, the lobes of the inner ring and outer ring together defining a lock-receiving opening for receiving the barrel lock, the barrel lock holding the outer ring and inner ring together.

19. The lockable meter retention ring assembly as defined in claim 18 wherein the inner ring comprises two substantially semi-circular parts, the division between the two parts dividing the lobe of the inner ring, and the flange of the outer ring engages both parts of the inner ring generally opposite the lobe thereof.

20. The lockable meter retention ring assembly as defined in claim 18 wherein the lock-receiving opening defined by the lobes of the inner and outer rings is disposed perpendicularly with respect to the plane of the outer ring, whereby the barrel lock is received in the lock-receiving opening from the front of the outer ring.

21. The lockable meter retention ring assembly as defined in claim 18 wherein the lock-receiving opening defined by the lobes of the inner and outer rings and the barrel lock received therein are disposed generally tangentially to the outer ring.

22. The lockable meter retention ring assembly as defined in claim 21 wherein the lobe of the outer ring has a piece of metal stock welded therein defining an opening for receiving the head of the barrel lock.

* * * * *